(12) United States Patent
Dai

(10) Patent No.: US 6,278,345 B1
(45) Date of Patent: Aug. 21, 2001

(54) FLEXIBLE PRINTED CIRCUIT AND THE METHOD FOR MAKING THE SAME

(75) Inventor: Hsin-Kuo Dai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/373,915

(22) Filed: Aug. 12, 1999

(30) Foreign Application Priority Data

Apr. 2, 1999  (TW) ................................................ 88105245

(51) Int. Cl.$^7$ ........................................................ H01P 3/08
(52) U.S. Cl. ............................................. 333/238; 174/254
(58) Field of Search ..................................... 333/238, 236, 333/246, 99 R, 1; 174/254, 261; 361/778, 794

(56) References Cited

U.S. PATENT DOCUMENTS 5,479,138 * 12/1995 Kuroda et al. ............................ 333/1
5,539,360 *  7/1996 Vannatta et al. ......................... 333/4

OTHER PUBLICATIONS

Transmission line with windowed ground plane, Sep. 1, 1990, IBM Technical Disclosure Bulletin, vol. No. 33 pp. 152–153.*

* cited by examiner

Primary Examiner—Robert Pascal
Assistant Examiner—Kimberly E Glenn
(74) Attorney, Agent, or Firm—Wei Te Chung

(57) ABSTRACT

A flexible printed circuit comprises a flexible insulative board having a first surface and a second surface opposite thereto. At least one conductive transmission line is formed on the first surface and comprises same length of a plurality of tested sections. Each tested section has an original characteristic impedance and the original characteristic impedance of each tested sections is beyond an acceptable tolerance to a standard value. A compensation region is defined at the second surface and separated into a plurality of compensation units having identical area. Each compensation unit is vertically related to a specific tested section of the at least one transmission line and having a conductive region and a non-conductive region. A final characteristic impedance of the tested section is obtained within an acceptable tolerance to the standard value due to compensation of the compensation unit.

26 Claims, 4 Drawing Sheets

FLEXIBLE PRINTED CIRCUIT AND THE METHOD FOR MAKING THE SAME

BACKGROUND OF THE INVENTION

1. Field of The Invention

The present invention relates to a flexible printed circuit and the method for making the same, especially to a printed circuit which can compensate the original characteristic impedance of the conductor trace thereof for obtaining a new value of characteristic impedance which is in an allowable range of a standard value.

2. The Prior Art

Flexible printed circuit (FPC) has been used in many fields for years such as the consumer products including the walk-man, the cellular phone, and the computer peripheral products including the printer, the disk drive. A conventional flexible printed circuit is shown in FIG. 7, wherein an adhesive layer 2 is formed in a flexible insulative board 1 and a pattern of conductor traces 3 are then formed on the adhesive layer 2 via a photoresist technique. This FPC works well only in low frequency but it may cause malfunction in high frequency. This is because the conductor trace 3 of the FPC functions as a transmission line other than a simple conductor line. The characteristic impedance of the conductor trace has to be considered in a high frequency environment. Normally, the characteristic impedance of a transmission line is determined by the line width, the line thickness, the dielectric constant of the insulative material, the distance thereof to the grounding potential.

Conventionally, to design an FPC having a desired constant characteristic impedance along the length thereof, an ideal grounding plane 4 such as copper foil shown in FIG. 8 is provided at an opposite side of the pattern of conductor traces 3 of FIG. 7. The characteristic impedance distribution is controlled by the physical structure of the transmission line such as the width and the thickness along the lengthwise direction thereof and the distance between the transmission line and the grounding plane. The physical dimension of the transmission line may have to be repeatedly adjusted along the lengthwise direction thereof according to repeated testing for maintaining the characteristic impedance thereof along the line within an allowable tolerance to a standard value. However, the job for repeatedly testing and adjusting the physical dimension of the transmission line is cumbersome, expensive, and may cause errors. It is even more difficult to adjust the distance between the transmission line and the grounding plane for obtaining a constant characteristic impedance along the line because this method needs to change the thickness of the insulative board repeatedly by sections.

It is requisite to provide a new structure of an FPC having a constant characteristic impedance value along a length thereof.

SUMMARY OF THE INVENTION

The primary purpose of the present invention is to provide an FPC having a proper characteristic impedance distribution within an acceptable tolerance to a standard value.

The second purpose of the present invention is to provide a method for making an FPC having a characteristic impedance distribution within an acceptable tolerance to a standard value.

In accordance with one aspect of the present invention, a flexible printed circuit comprises a flexible insulative board having a first surface and a second surface opposite thereto. At least one conductive transmission line is formed on the first surface and(comprises same length of a plurality of tested sections. Each tested section has an original characteristic impedance and the original characteristic impedance of each tested section is beyond a tolerance to a standard value. A compensation region is defined at the second surface and separated into a plurality of compensation units having identical area. Each compensation unit is vertically related to a specific tested section of the at least one transmission line and having a conductive region and a non-conductive region. A final characteristic impedance of the tested section is obtained within an acceptable tolerance to the standard value due to compensation of the compensation unit.

In accordance with another aspect of the present invention, a method for making a flexible printed circuit comprising steps of: (a)forming a first conductive layer on a first surface of a flexible insulative board; (b)forming at least one transmission line on the first surface by removal of a portion of the first conductive layer; (c)defining the at least one transmission line into same length of a plurality of tested sections, each tested section having an original characteristic impedance, wherein the original characteristic impedance of each tested sections are beyond a tolerance to a standard value; (d) defining a compensation region at a second surface of the flexible insulative board opposite the first surface and separating the compensation region into a plurality of compensation units having identical area, each compensation unit vertically corresponding to a specific tested section of the at least one transmission line and having a conductive region and a non-conductive region; and (e)determining a specific ratio of the conductive region area to the compensation unit area based an offset between the original characteristic impedance and the standard value so that the compensation unit can compensate the original characteristic impedance of the tested section of the transmission line opposite the compensation unit and resulting in a final characteristic impedance of the tested section of the at least one transmission line in a tolerance to the standard value.

DETAILED DESCRIPTION OF THE PREFERRED EMBODIMENT

Figure 1:
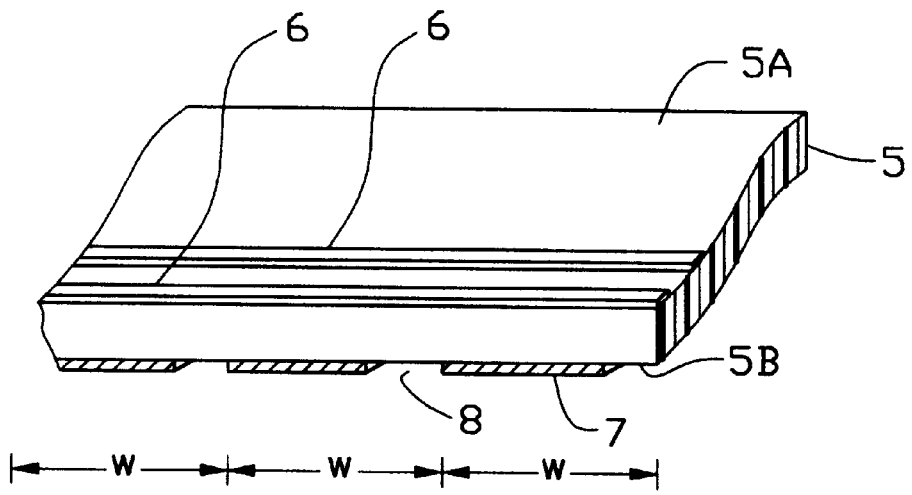
FIG. 1 is a perspective view of a flexible printed circuit in accordance with the present invention.

Referring to FIG. 1, a flexible printed circuit (FPC) comprises a flexible insulative board 5 having a first surface 5A and a second surface 5B opposite to the first surface 5A. A plurality of transmission lines 6 are attached to the first surface 5A and substantially parallel to each other. Each transmission line 6 comprises a plurality of tested section 6A of a same length, and each tested section 6A has an original characteristic impedance, wherein the original characteristic impedance of some tested sections 6A are beyond an acceptable tolerance to a standard value. A plurality of grounding plates 7 are attached to the second surface 5B and substantially parallel to each other. Each grounding plate 7 has a lengthwise direction substantially perpendicular to a lengthwise direction of each transmission line 6. A conductive strap 7A extends perpendicular to the grounding plates 7 and integrally connects the grounding plates 7 together.

Figure 2:
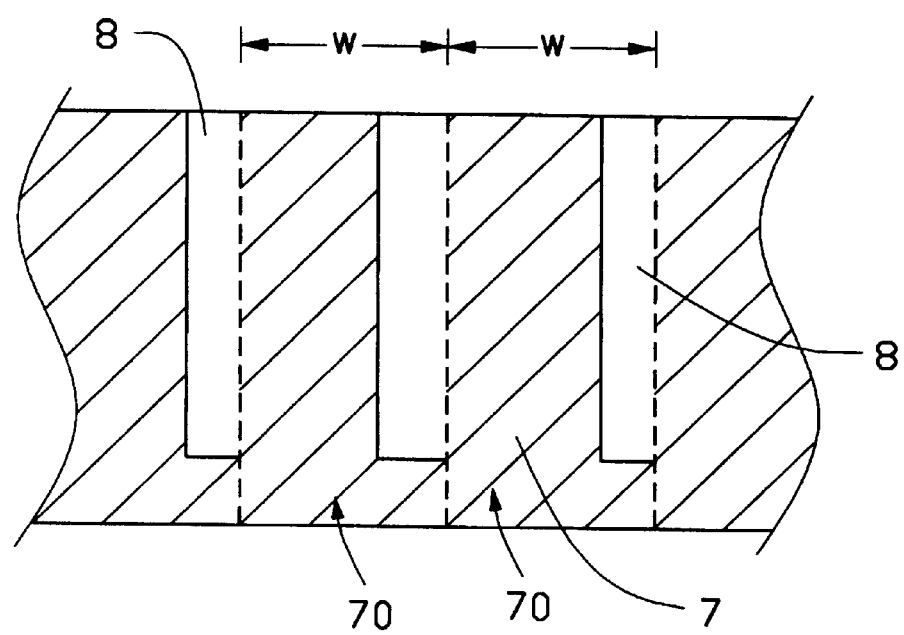
FIG. 2 is a bottom view of FIG. 1.
Figure 6:
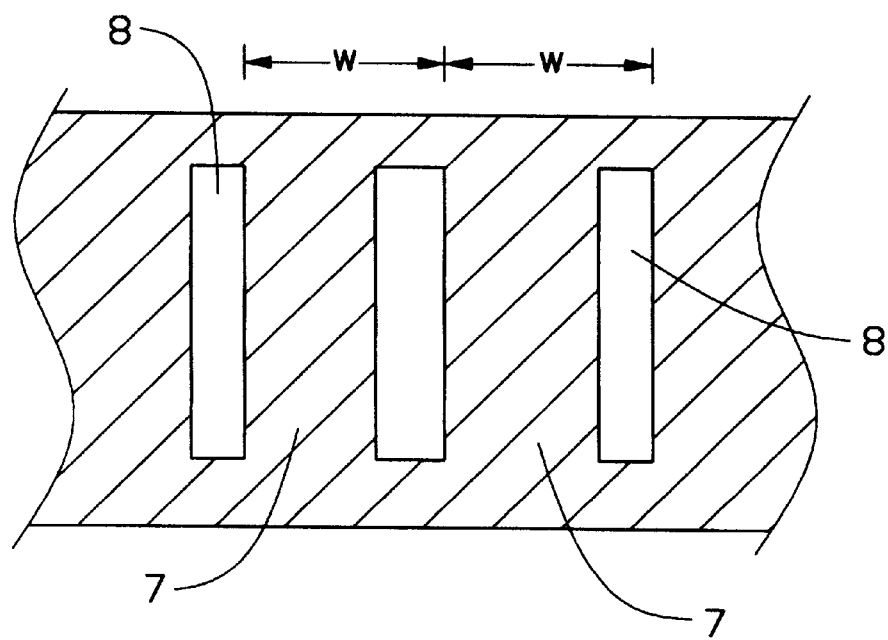
FIG. 6 is a bottom view of a fourth embodiment of a flexible printed circuit in accordance with the present invention.

In making the FPC, conductor layers made of copper or silver are respectively formed on the opposite surfaces 5A and 5B of the flexible insulative board 5. An etching procedure is performed on the conductor layer of the first surface 5A to obtain the transmission lines 6. A compensation region is defined at the second surface 5B and a screen printing procedure is performed thereon to obtain the grounding plates 7 spaced with each other by exposed sections 8 which were originally covered by the conductor layer, wherein the grounding plates 7 have at least one ends thereof connected to each other as shown in FIGS. 2 and 6. In this embodiment, the extension direction of the grounding plates 7 are substantially perpendicular to an extension direction of the transmission lines 6. Actually, the compensation region only requires that the extension direction of the grounding plates 7 not parallel to the extension direction of the transmission line 6.

Figure 5:
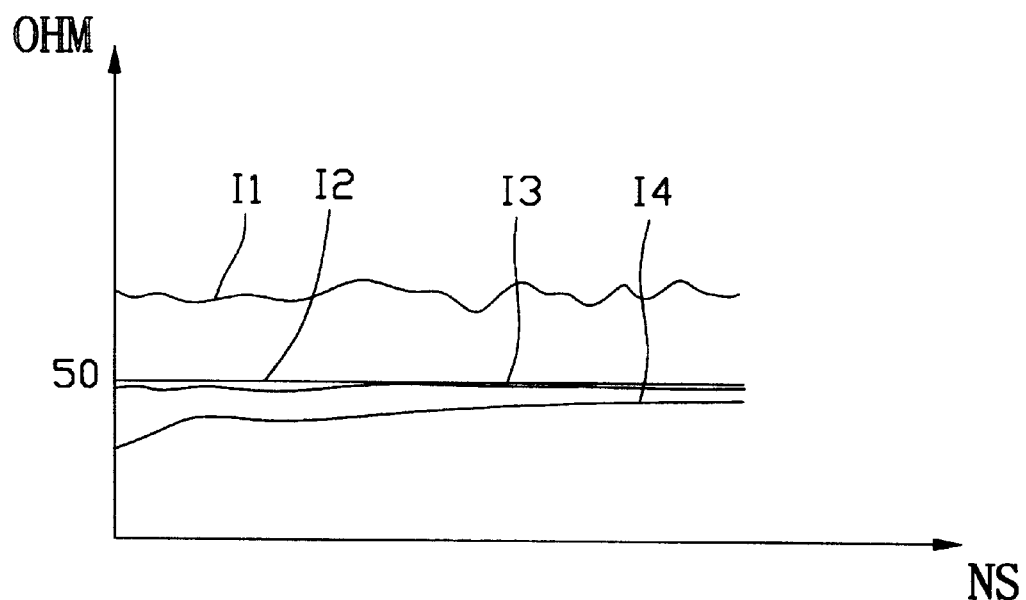
FIG. 5 are a plurality of characteristic impedance distributions of different structures of flexible printed circuit.
Figure 7:
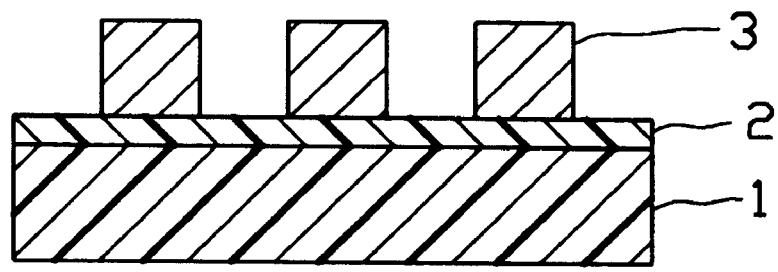
FIG. 7 is a schematic view of a conventional flexible printed circuit.
Figure 8:
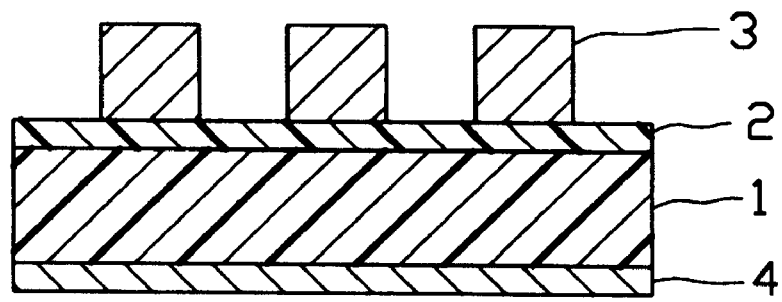
FIG. 8 is a schematic view of another conventional flexible printed circuit.

Referring to FIG. 5, four characteristic impedance curves I1, I2, I3, and I4 are illustrated to respectively represent four kinds of FPCs, wherein horizontal axis is time (nanosecond) which is equivalent to distance because the propagation speed of signal is presumed the same along the transmission line and the vertical axis is resistance (ohm). The curve I1 represents a first characteristic impedance distribution for the FPC of FIG. 7 in which no grounding layer is formed in the opposite side of the FPC to the transmission lines 3, therefore no compensation to the original characteristic impedance of the transmission lines 3. The curve I2 represents a second characteristic impedance distribution for a standard characteristic impedance value which is, for example, 50 ohm. It is impossible to make an FPC having the ideal curve I2. Therefore, I2 herein is only for comparison with other curves. The curve I3 represents a third characteristic impedance distribution for the FPC of FIG. 1 in which the original characteristic impedance of the transmission line 6 experiences compensation by the grounding plates 7 formed on the second surface 5B of the FPC and changed to a more acceptable distribution substantially identical to the curve I2. The curve I4 represents a fourth characteristic impedance distribution for the FPC of FIG. 8 in which the grounding layer 4 covers a whole surface of the FPC, therefore compensation to the transmission line 3 is too much thus causing the curve I4 to located all the way below the standard value (compared with curve I2).

It can be appreciated from the curves I1, I2, I3, and I4 that the characteristic impedance for a tested section of a transmission line, the final characteristic impedance is much greater than the standard value if the corresponding opposite location of the FPC relative to the tested section is not covered with any grounding plate, and the final characteristic impedance is much less than the standard value if the corresponding opposite location of the FPC relative to the tested section is totally covered with a grounding plate. It can be concluded that a partially covered grounding plate may cause the final characteristic impedance within acceptable tolerance to the standard value as shown in the curve of I3. For precisely adding the partial grounding plate on opposite side of the FPC relative to the transmission line, a method is provided in the subsequent description.

Further referring to FIGS. 1 and 2, a method for making an FPC having a required characteristic impedance comprises a first step of determining a compensation region at the second surface 5B of the FPC relative to the transmission line 6 formed in the first surface 5A. Respectively calculate and obtain the characteristic impedance distribution curves I1 and I4 of FIG. 5 by simulation of non grounding layer and fully-covered grounding layer. Obtain the standard characteristic impedance curve I2 from customers or clients. Separate the compensation region into a plurality of compensation units 70 each of which has a same area. Properly forming a pattern of grounding plate 7 on the compensation region of the FPC so that a ratio D of the grounding plate area in a specific compensation unit 70 to the whole compensation unit area is obtained by the following formula:

$$D=(Z_{hi}-Z_{std})/(Z_{hi}-Z_{lo}) (1), \text{ wherein}$$

$Z_{hi}$: the characteristic impedance of the transmission line section when the corresponding compensation-unit is not covered by any grounding plate;

$Z_{std}$: the standard characteristic impedance; and $Z_{lo}$: the characteristic impedance of the transmission line section when the corresponding compensation unit is totally covered by a grounding plate.

This formula is resulted from an original formula:

$$Z_{lo}D+Z_{hi}(1-D)=Z_{std} (2)$$

Further referring to FIGS. 1 and 2, each rectangular region having a width W is the compensation unit 70 and adjacent compensation units 70 are particularly separated by a phantom line for illustrative purpose. The area of each grounding plate 7 in the compensation unit 70 compared to the total area thereof is D. Each ratio D of each compensation unit 70 is calculated in advance according to formula (1), so that a pattern of a screen filter can be obtained, i.e., the proper screen filter (not shown) can be made. With the proper screen filter, the characteristic impedance of each tested section of the transmission line 6 can be guaranteed to be within an acceptable tolerance to the standard value.

The method for making the FPC is also suitable for a transmission line whose curve I1 has a portion within an acceptable tolerance to the standard value and another portion beyond the acceptable tolerance to the standard value. For this situation, the compensation region may be only defined in a site of the second surface which is opposite the beyond-tolerance portion of the tested sections and the subsequent procedures are similar to the above mentioned and omitted herein.

Figure 3:
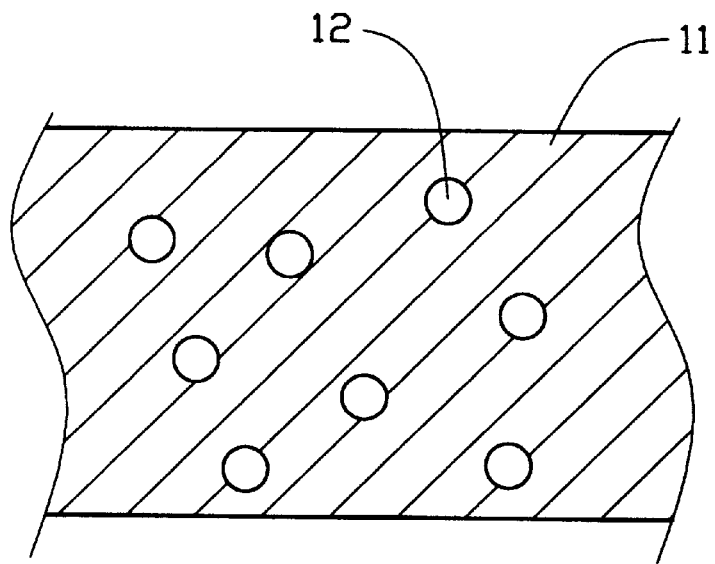
FIG. 3 is a bottom view of a second embodiment of a flexible printed circuit in accordance with the present invention.

A second embodiment is shown in FIG. 3, wherein the exposed sections 8 of the first embodiment is replaced with circular exposed sections 12, and the grounding plates 7 of the first embodiment is replaced with a grounding plate 11.

Figure 4:
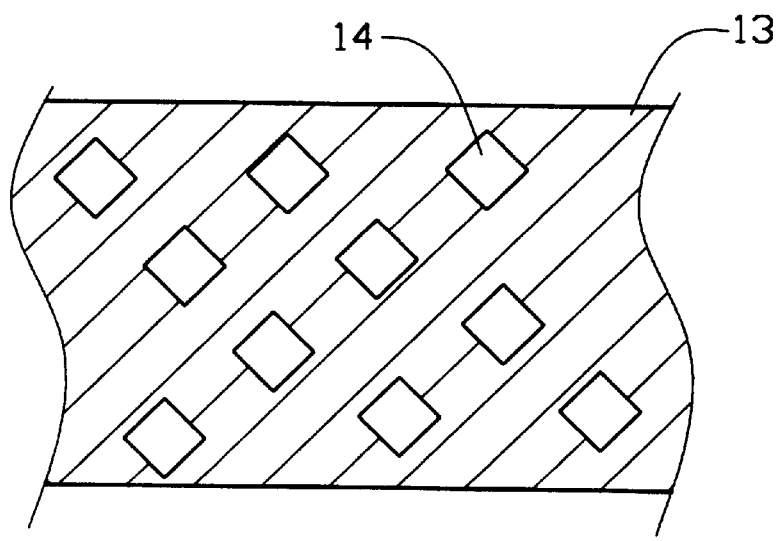
FIG. 4 is a bottom view of a third embodiment of a flexible printed circuit in accordance with the present invention.

Similarly, a third embodiment is shown in FIG. 4, wherein the exposed sections 8 of the first embodiment is replaced with rectangular exposed sections 14, and the grounding plates 7 of the first embodiment is replaced with a grounding plate 13.

Many other patterns may work for making the screen filter. It can be concluded that the smaller of each compensation unit the more identical of the final characteristic impedance curve I3 to the standard characteristic impedance curve I2.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A flexible printed circuit comprising:
   a flexible insulative board having a first surface and a second surface opposite to the first surface;
   at least one conductive transmission line formed on the first surface of the flexible insulative board and the at least one transmission line comprising a plurality of tested sections of a same length, each tested section having an original characteristic impedance, wherein the original characteristic impedances of some tested sections are beyond an acceptable tolerance to a standard value;
   a compensation region defined at the second surface of the flexible insulative board and separated into a plurality of compensation units having identical area, each compensation unit vertically related to a specific tested section of the at least one transmission line and having a conductive region and a non-conductive region, wherein a specific ratio of the conductive region area to the compensation unit area is determined based on an offset between the original characteristic impedance and the standard value so that the compensation unit can compensate the original characteristic impedance of the tested section of the transmission line opposite the compensation unit and resulting in a final characteristic impedance of the tested section of the at least one transmission line within the acceptable tolerance to the standard value.

2. The flexible printed circuit as claimed in claim 1, wherein the conductive regions of the compensation units are strap-like and parallel to each other.

3. The flexible printed circuit as claimed in claim 2 further comprises an additional conductive strap connected to the parallel conductive regions.

4. The flexible printed circuit as claimed in claim 3, wherein the parallel conductive regions are perpendicular to the additional conductive strap.

5. The flexible printed circuit as claimed in claim 2 further comprising two additional conductive straps connected to distal ends of each of the parallel conductive regions.

6. The flexible printed circuit as claimed in claim 5, wherein the parallel conductive regions are perpendicular to the additional conductive straps.

7. The flexible printed circuit as claimed in claim 2, wherein the ratio of the conductive region area to the compensation unit area is determined by an offset of the original characteristic impedance of the tested section of the transmission line to the standard characteristic impedance.

8. The flexible printed circuit as claimed in claim 2, wherein the at least one transmission line has a first extension direction substantially perpendicular to a second extension direction of the strap-like conductive regions.

9. The flexible printed circuit as claimed in claim 2, wherein the at least one transmission line has a first extension direction not parallel to a second extension direction of the strap-like conductive regions.

10. The flexible printed circuit as claimed in claim 1, wherein the conductive regions in the compensation region constitute a grid pattern.

11. The flexible printed circuit as claimed in claim 1, wherein at least one of the non-conductive regions has a circular shape.

12. The flexible printed circuit as claimed in claim 1, wherein at least one of the non-conductive regions has a rectangular shape.

13. A method for making a flexible printed circuit comprising steps of:
   (a) forming a first conductive layer on a first surface of a flexible insulative board;
   (b) forming at least one transmission line on the first surface by removal of a portion of the first conductive layer;
   (c) defining the at least one transmission line into same length of a plurality of tested sections, each tested section having an original characteristic impedance, wherein the original characteristic impedance of each tested sections is beyond a tolerance to a standard value;
   (d) defining a compensation region at a second surface of the flexible insulative board opposite the first surface and separating the compensation region into a plurality of compensation units having identical area, each compensation unit vertically corresponding to a specific tested section of the at least one transmission line and having a conductive region and a non-conductive region;
   (e) determining a specific ratio of the conductive region area to the compensation unit area based on an offset between the original characteristic impedance and the standard value so that the compensation unit can compensate the original characteristic impedance of the tested section of the transmission line opposite the compensation unit and resulting in a final characteristic impedance of the tested section of the at least one transmission line in a tolerance to the standard value.

14. The method as claimed in claim 13, wherein the conductive regions of the compensation units are strap-like and at least a portion thereof are parallel to each other.

15. The method as claimed in claim 14, wherein the at least a portion of parallel strap-like conductive regions each have at least one end connected to a conductive strap not parallel thereto.

16. The method as claimed in claim 13, wherein the at least a portion of the parallel conductive regions are perpendicular to the conductive strap not parallel thereto.

17. The method as claimed in claim 14, wherein the at least a portion of parallel conductive regions are connected between two conductive straps not parallel thereto.

18. The method as claimed in claim 17, wherein the at least a portion of parallel conductive regions are perpendicular to the conductive straps not parallel thereto.

19. The method as claimed in claim 13, wherein the ratio of the conductive region area to the compensation unit area is determined by an offset of the original characteristic impedance of the tested section of the transmission line to the standard characteristic impedance.

20. The method as claimed in claim 14, wherein the at least one transmission line has a first extension direction substantially perpendicular to a second extension direction of the at least a portion of the parallel conductive regions.

21. The method as claimed in claim 14, wherein the at least one transmission line has a first extension direction not parallel to a second extension direction of the at least a portion of the parallel conductive regions.

22. The method as claimed in claim 13, wherein the conductive regions in the compensation region constitute a grid pattern.

23. The method as claimed in claim 13, wherein at least one of the non-conductive regions has a circular shape.

24. The method as claimed in claim 13, wherein at least one of the non-conductive regions has a rectangular shape.

25. The method as claimed in claim 13, wherein the specific ratio of the conductive region area to the compensation unit area in each compensation unit is determined by a relation: $D=(Z_{hi}-Z_{std})/(Z_{hi}-Z_{lo})$ wherein D: the specific ratio of the conductive region area to the compensation unit area in each compensation unit; $Z_{hi}$: the characteristic impedance of the transmission line section when the corresponding compensation unit is not covered by any grounding plate;

$Z_{std}$: the standard characteristic impedance; and $Z_{lo}$: the characteristic impedance of the transmission line section when the corresponding compensation unit is totally covered by a grounding plate.

26. A flexible printed circuit comprising:

a flexible insulative board having a first surface and a second surface opposite to the first surface;

at least one conductive transmission line formed on the first surface of the flexible insulative board and the at least one transmission line comprising a plurality of tested sections with a same length, each tested section having an original characteristic impedance, wherein the original characteristic impedance of at least one tested section is beyond an acceptable tolerance to a standard value;

a compensation unit defined at a corresponding site of the second surface of the flexible insulative board opposite the location of the at least one beyond-tolerance tested section, the compensation unit including a conductive region and a non-conductive region, wherein a specific ratio of the conductive region area to the compensation unit area is determined based on an offset between the original characteristic impedance of the at least one beyond-tolerance tested section and the standard value so that the compensation unit can compensate the original characteristic impedance of the at least one beyond-tolerance tested section of the transmission line and resulting in a final characteristic impedance of the at least one beyond-tolerance tested section within the acceptable tolerance to the standard value.

* * * * *